United States Patent
Sakai et al.

(10) Patent No.: US 8,053,678 B2
(45) Date of Patent: Nov. 8, 2011

(54) INTERCONNECTION, ELECTRONIC DEVICE AND METHOD FOR MANUFACTURING AN ELECTRONIC DEVICE

(75) Inventors: Tadashi Sakai, Yokohama (JP); Naoshi Sakuma, Yokohama (JP); Masayuki Katagiri, Kawasaki (JP); Tomio Ono, Yokohama (JP); Mariko Suzuki, Yokohama (JP)

(73) Assignee: Kabushiki Kaisha Tohshiba, Tokyo (JP)

( * ) Notice: Subject to any disclaimer, the term of this patent is extended or adjusted under 35 U.S.C. 154(b) by 876 days.

(21) Appl. No.: 12/062,112

(22) Filed: Apr. 3, 2008

(65) Prior Publication Data

US 2008/0245553 A1   Oct. 9, 2008

(30) Foreign Application Priority Data

Apr. 5, 2007   (JP) ................ P2007-099542

(51) Int. Cl.
H05K 1/11   (2006.01)

(52) U.S. Cl. ....................... 174/261; 977/742

(58) Field of Classification Search ......... 174/261, 174/262; 438/6; 977/743, 738, 740, 742
See application file for complete search history.

(56) References Cited

U.S. PATENT DOCUMENTS

| | | | |
|---|---|---|---|
| 2002/0163079 A1* | 11/2002 | Awano ................. | 257/750 |
| 2003/0132393 A1* | 7/2003 | Dimitrijevic et al. ...... | 250/423 F |
| 2006/0091557 A1 | 5/2006 | Sakamoto et al. | |
| 2007/0284557 A1* | 12/2007 | Gruner et al. ............. | 252/500 |

FOREIGN PATENT DOCUMENTS

| | | |
|---|---|---|
| JP | 2002-329723 | 11/2002 |
| WO | WO 2004/051726 A1 | 6/2004 |

* cited by examiner

*Primary Examiner* — Timothy Thompson
*Assistant Examiner* — Roshn Varghese
(74) *Attorney, Agent, or Firm* — Oblon, Spivak, McClelland, Maier & Neustadt, L.L.P.

(57) ABSTRACT

An interconnection includes a bundle of conductive members, each of the conductive members being made of carbon nanotube having an end connected to a first conductive film, and another end connected to a second conductive film separated from the first conductive film; and carbon particles each having a diamond crystal structure, dispersed between the conductive members.

11 Claims, 4 Drawing Sheets

INTERCONNECTION, ELECTRONIC DEVICE AND METHOD FOR MANUFACTURING AN ELECTRONIC DEVICE

CROSS REFERENCE TO RELATED APPLICATIONS AND INCORPORATION BY REFERENCE

This application is based upon and claims the benefit of priority from prior Japanese Patent Application P2007-099542 filed on Apr. 5, 2007; the entire contents of which are incorporated by reference herein.

BACKGROUND OF THE INVENTION

1. Field of the Invention

The present invention relates to an interconnection, an electric device and a method for manufacturing an electric device using a carbon nanotube.

2. Description of the Related Art

In semiconductor devices, such as large-scale integrated circuits (LSIs) and the like, higher integration and miniaturization have advanced year to year, as shown by Moor's law or a semiconductor road map. Along with the advancement of semiconductor devices, interconnections having fine dimension are also required for the semiconductor devices. The interconnection material, which started with aluminum (Al), has been replaced with copper (Cu) due to the demands for increased current density along with the miniaturization. Currently, the miniaturization is advancing due to various technical innovations based on the use of Cu for the interconnection.

However, in the 32 nm half-pitch (HP) technology node, a high current density that exceeds the limit of Cu material is required. For this reason, new materials and techniques for interconnections are required to replace the interconnections that use Cu. In response to the demand for replacing Cu in the interconnects, a candidate for an interconnection technique is to replace the Cu interconnection with an interconnection structure in which a bundle of carbon nanotubes are used.

A carbon nanotube has lower resistance and higher thermal conduction, as compared with the usual metal interconnection materials. Therefore, it has been reported that the carbon nanotubes have very high resistance characteristics to current density, on the order of about 1000 times higher than a low electrical resistance metals such as Cu and the like, per the same sectional area. It is also expected that performance deterioration caused by atomic-level migration may be substantially prevented due to the structural strength of the carbon nanotube. Hence, a high current density may be achieved by forming a bundle of carbon nanotubes and by using the bundle of carbon nanotubes as the interconnection.

On the other hand, it is difficult to grow the bundle of carbon nanotubes having the high density and fine dimension that is demanded for the 32 nm HP technology node. For this reason, with a balance between dispersion and size control of a catalyst metal used for growth of the carbon nanotube, the bundle of carbon nanotubes is grown with a lower density than that of the closest packed structure. The structure of the bundle of low-density carbon nanotubes may possibly decrease the mechanical strength when used as a plug between wiring layers. Also, the interconnection resistance may be increased.

An interconnection structure has been proposed in which a mixture of metal and carbon nanotube is used as the interconnection material (refer to WO2004/051726 pamphlet). The proposed interconnection structure decreases interconnection resistance and to suppress migration of the metal. However, it is difficult to perfectly suppress the migration of the metal included in the interconnection structure. That is, as miniaturization increases the current density, it is impossible to ignore the deterioration in performance of the interconnection structure caused by the migration of the metal.

Moreover, an interconnection structure in which the structure body which has entirely metallic characteristics, such as fullerene enclosed metal, is arranged between the carbon nanotubes (refer to JP-A 2002-329723 (KOKAI)). The fullerene has a three-dimensional structure with lower thermal conduction than the carbon nanotube. For this reason, partial disconnection of the interconnection structure may easily occur due to local temperature increase so as to increase of interconnection resistance.

SUMMARY OF THE INVENTION

It is an object of the present invention to provide an interconnection having high reliability and capable of suppressing performance deterioration, as well as an electronic device using the interconnection and a method for manufacturing the same.

A first aspect of the present invention inheres in an interconnection including a bundle of conductive members, each of the conductive members being made of carbon nanotube having an end connected to a first conductive film, and another end connected to a second conductive film separated from the first conductive film; and carbon particles each having a diamond crystal structure, dispersed between the conductive members.

A second aspect of the present invention inheres in an electronic device including a first conductive film provided on a substrate; an interconnection including: a bundle of conductive members, each of the conductive members being made of carbon nanotube having an end connected to the first conductive film; and carbon particles, each having a diamond crystal structure, dispersed between the conductive members; and a second conductive film connected to another end of each of the conductive members, and separated from the first conductive film.

A third aspect of the present invention inheres in a method for manufacturing an electronic device including forming a first conductive film on a substrate; depositing a bundle of conductive members, each of the conductive members being made of carbon nanotube, such that an end of each of the conductive members connect to the first conductive film; impregnating the conductive members with a colloid solution in which carbon particles are dispersed, each of the carbon particles having a diamond crystal structure; dispersing the carbon particles between the conductive members by drying the colloid solution; and forming a second conductive film so as to connect another end of each the conductive members to the second conductive film.

DETAILED DESCRIPTION OF THE INVENTION

Figure 1:
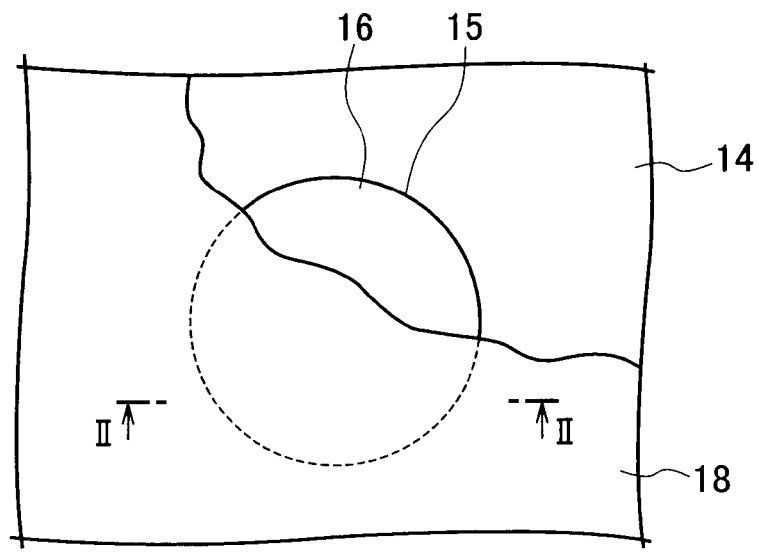
FIG. 1 is a plan view showing an example of a semiconductor device according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
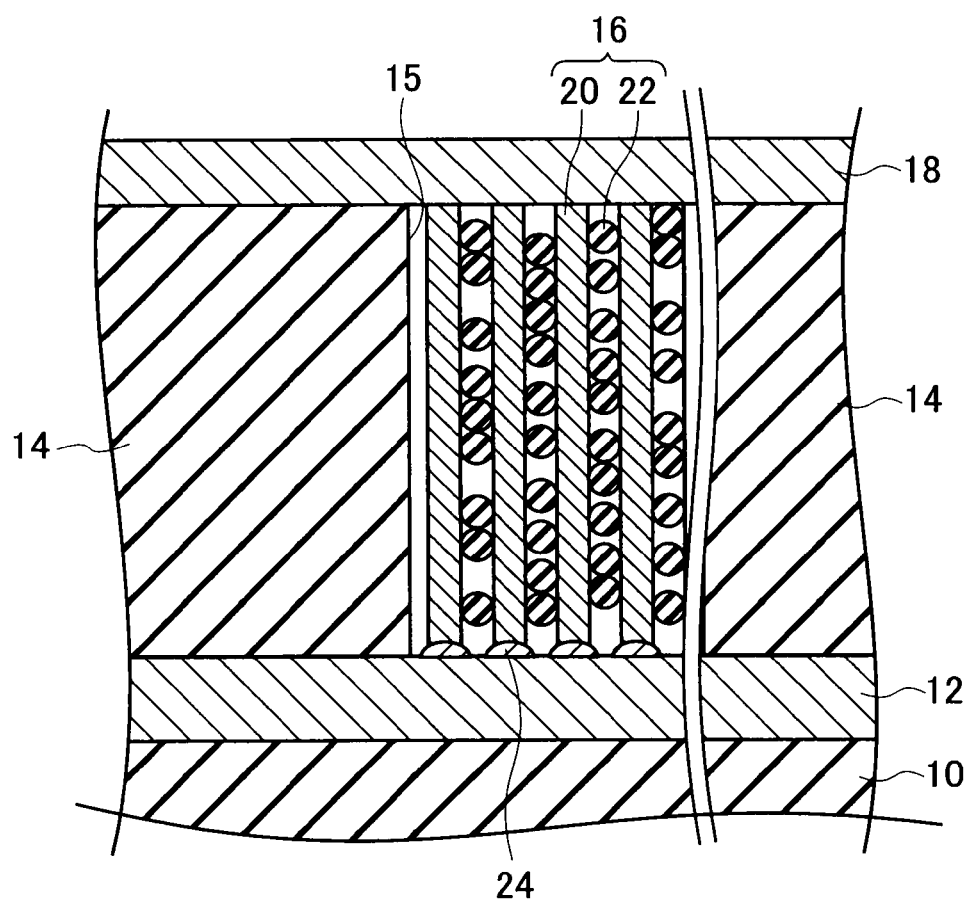
FIG. 2 is a cross sectional view taken along line II-II of the semiconductor device shown in FIG. 1.

An electronic device, such as a semiconductor device and the like, according to an embodiment of the present invention, includes a first conductive film (bottom conductive film) 12, an interlevel dielectric film 14, an interconnection (plug) 16, a second conductive film (top conductive film) 18 and the like, on an underlying insulating film 10, as shown in FIGS. 1, 2. Also, the electronic device includes a substrate (not shown) in which transistors and the like are formed, below the underlying insulating film 10. The bottom conductive film 12 is a wiring layer provided on the underlying insulating film 10 and the top conductive film 18 is another wiring layer provided on the interlevel dielectric film 14. The films 12 and 18 are electrically connected through the plug 16. The interlevel dielectric film 14 has a through hole 15 in which the plug 16 is provided.

The plug 16 includes a plurality of conductive members 20 provided in a bundle and carbon particles 22 dispersed between the conductive members 20. An end of each of the conductive members 20 is electrically connected to the bottom conductive film 12 provided beneath the interlevel dielectric film 14. The other end of each of the conductive members 20 is electrically connected to the top conductive film 18 provided on the interlevel dielectric film 14. The conductive members 20 are provided on a catalyst metal layer 24 on a surface of the bottom conductive film 12.

Figure 3:
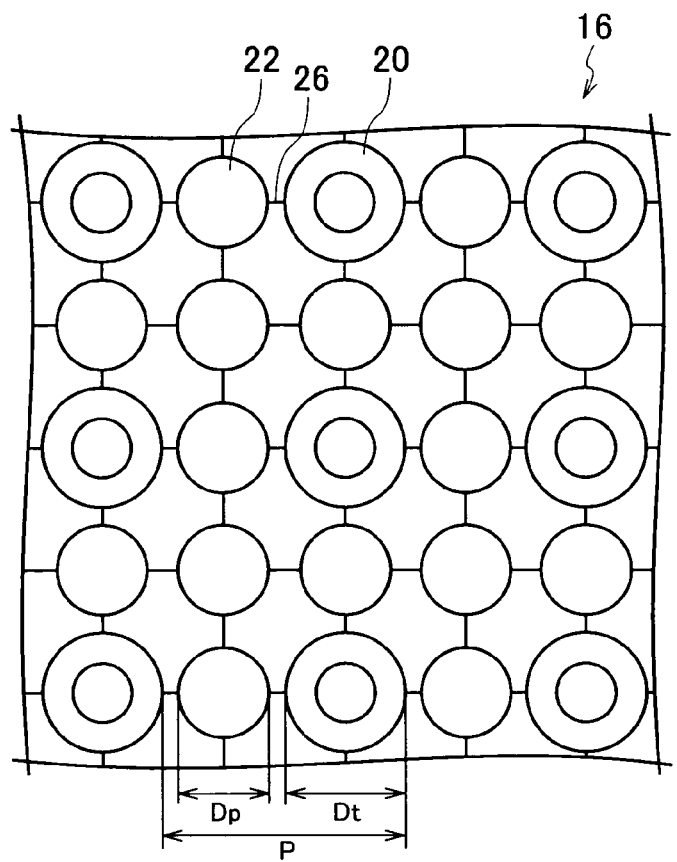
FIG. 3 is a schematic view showing an example of an interconnection used in an explanation of the embodiment of the present invention.

Filament-type carbon, such as carbon nanotube, is used as the conductive members 20. As shown in FIG. 3, each of the conductive members 20 has an average diameter Dt and an average pitch P. The average diameter Dt of each conductive member 20 is in a range of about 2 nm to about 10 nm, and desirably about 4 nm to about 6 nm. The average pitch P is in a range of about 4 nm to about 20 nm, and desirably about 8 nm to about 12 nm. In order to achieve lower resistance of the plug 16, a surface density of the conductive members 20 may be in a range of about $8 \times 10^{11}$ cm$^{-2}$ to about $1.2 \times 10^{12}$ cm$^{-2}$.

Graphite or diamond may be used for the carbon particles 22. Particularly, a particle having a diamond crystal structure is superior in structural strength and thermal conduction compared to a fullerene structure. An average particle diameter Dp of each carbon particle 22 is desirably not more than the average diameter of the conductive member 20. For example, the average particle diameter Dp of the carbon particle 22 is in a range of about 2 nm to about 10 nm, and desirably about 3 nm to about 5 nm.

Metal particles, such as cobalt (Co), nickel (Ni), iron (Fe) and the like, or an alloy containing Co, Ni, Fe or the like as a major component, may be used for the catalyst metal layer 24. The diameter of each of the carbon nanotubes used for the conductive members 20 can be determined by the diameter of each of the metal particles used for the catalyst metal layer 24. Therefore, the average particle diameter of the metal particles used for the catalyst metal layer 24 may be in a range of about 2 nm to about 10 nm, and desirably about 4 nm to about 6 nm.

Additionally, a metal, such as Cu, Al, tungsten (W) and the like, may be used for the bottom conductive film 12 and the top conductive film 18. An insulating film, such as a silicon oxide ($SiO_2$) film, a silicon nitride ($Si_3N_4$) film, a low dielectric constant (low-k) insulating film and the like, may be used for the underlying insulating film 10 and the interlevel dielectric film 14. An inorganic material, such as carbon doped silicon oxide (SiOC), inorganic spin-on glass (SOG) and the like, or an organic material, such as organic SOG and the like, may be used for the low-k insulating film. Also, a laminated film of an inorganic material film and an organic material film, and the like, may be used for the low-k insulating film.

In the interconnection structure shown in FIG. 1, conductive material, such as the carbon nanotube, is used for the plug 16 in which the current density may be increased. The carbon nanotube has an allowable current density that is about 100 times to about 1000 times higher than an interconnection material made of Cu and the like. That is, in the carbon nanotube, carbon (C) atoms are strongly bonded to each other. Thus, migration of the C atoms, which causes performance deterioration, such as disconnection and the like, substantially does not occur. Also, since the carbon nanotube has a substantially one-dimensional structure, electrons in the carbon nanotube can be transported without any scattering in the carbon nanotube, that is, with the ballistic transport. Hence, it is possible to achieve lower resistance compared to a metal material, such as Cu and the like.

When the carbon nanotubes are used for the conductive members 20, the carbon particles 22 are dispersed between the carbon nanotubes. Thus, a mechanically stable retention structure is formed. Also, since the structure of the plug 16 is formed by the carbon nanotubes and the carbon particles 22, the plug 16 may have the same thermal and chemical characteristics with the carbon nanotubes, and resistance characteristics of the plug 16 to the manufacturing processes can be improved. Also, since diamond crystal structure particles are used as the carbon particles 22, it is possible to increase the structural strength of the plug 16, and to improve the thermal conduction between the carbon nanotubes. As a result, it is possible to improve thermal stability and resistance characteristics of the plug 16.

As shown in FIG. 3, the carbon particles 22 are dispersed between the conductive members 20, such as the carbon nanotubes, and may be chemically bonded to the conductive members 20 by C atoms or bonding links 26 including C. For example, each of the bonding links 26 is a carbon bond or a cross-linking bond. Since the carbon particles 22 and the conductive members 20 are bonded through the bonding links 26, mechanical strength of the plug 16 can be increased. As a result, it is possible to suppress disconnection of the plug 16 so as to improve reliability.

Figure 4:
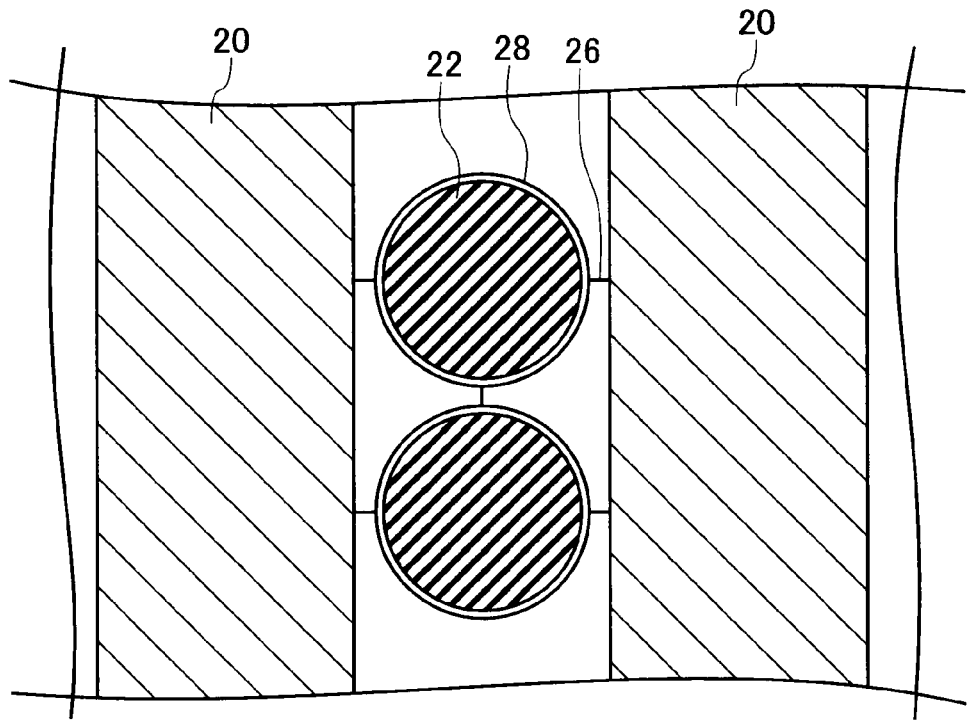
FIG. 4 is a cross sectional view showing an example of the interconnection used in the explanation of the embodiment of the present invention.

Furthermore, when the diamond-type particles are used for the carbon particles 22, as shown in FIG. 4, a conductive carbon film 28 having a $sp^2$ bond, such as a graphene film, a graphite film and the like, may be desirably formed on each surface of the carbon particles serving as diamond crystal cores. Due to the conductive property of the conductive carbon film 28 on the surface of the carbon particles 22, it is possible to add electrically conductive paths between the conductive members 20 through the carbon particles 22. Consequently, even if an excess current locally flows into a specific conductive member 20, it is possible to shunt the excess current through the conductive carbon film 28. Also, even if one of the conductive members 20 is broken, the current path may be assured through the carbon particles 22 between the conductive members 20. As a result, it is possible to prevent reduction of the electrically conductive paths of the conductive members 20 so as to ensure low resistance of the plug 16. The carbon films 28 and the conductive members 20 are bonded through the bonding links 26 including C-unsaturated bonds. Thus, it is possible to assure good electrical conduction through the plug 16.

In the embodiment of the present invention, it is possible to suppress the deterioration of the interconnection structure, and to provide a semiconductor device with high reliability.

A method for manufacturing a semiconductor device according to the embodiment of the present invention will be described below by using cross sectional views shown in FIGS. 5 to 8.

A circuit pattern of transistors and the like is transferred onto a substrate, such as a semiconductor substrate and the like. An underlying insulating film 10 is deposited on the transferred circuit pattern by chemical vapor deposition (CVD) and the like.

Figure 5:
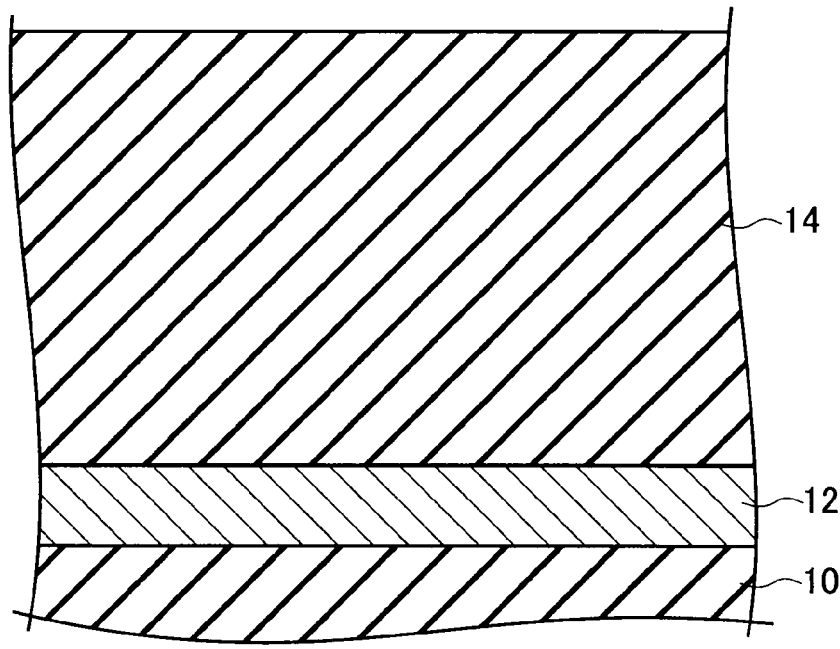
FIGS. 5 to 8 are cross sectional views showing an example of a manufacturing method of the semiconductor device according to the present invention.

As shown in FIG. 5, by evaporation, photolithography, dry etching and the like, a bottom conductive film 12, as a bottom wiring layer, is formed on the underlying insulating film 10. An insulating film (an interlevel dielectric film) 14 is deposited on the bottom conductive film 12.

Figure 6:
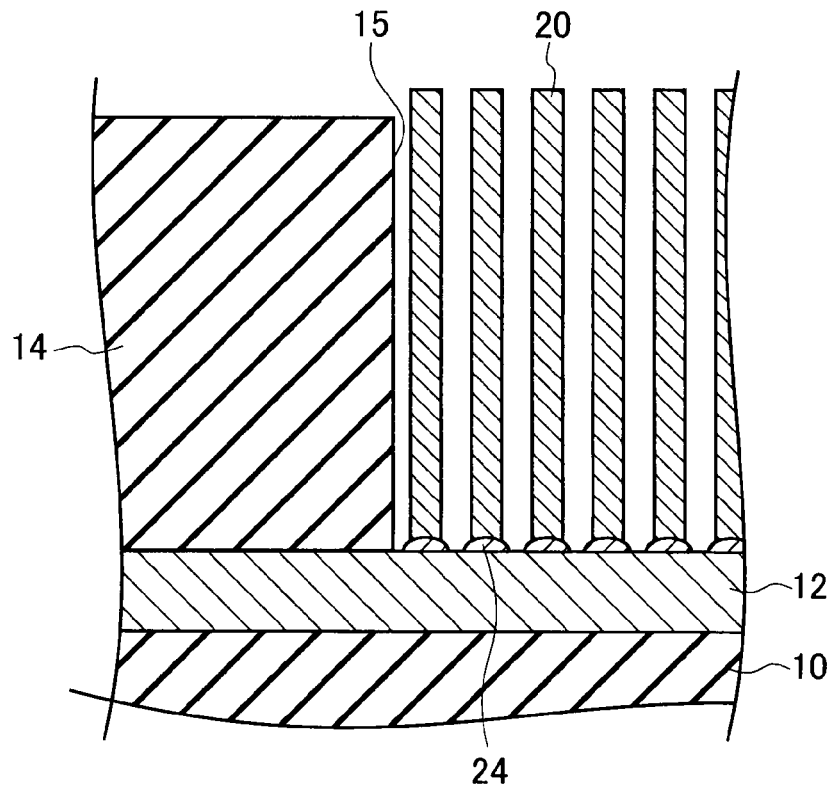

As shown in FIG. 6, by photolithography, dry etching and the like, a through hole 15 is formed in the interlevel dielectric film 14. Using the bottom conductive film 12 as an underlying layer, a plurality of metal particles, such as Co and the like, are deposited on a surface of the bottom conductive film 12, which is exposed in the through hole 15, so as to form a catalyst metal layer 24. An average diameter of each of the metal particles is, for example, about 5 nm, and a deposited surface density of the metal particles is about $1\times10^{12}$ cm$^{-2}$. A plurality of conductive members 20, such as a bundle of carbon nanotubes, are deposited on a surface of the catalyst metal layer 24 in the through holes 15 by chemical vapor deposition (CVD) and the like, so as to exceed the surface level of the interlevel dielectric film 14. An average diameter of the conductive members 20 is about 5 nm, corresponding to the average diameter of the metal particles.

Figure 7:
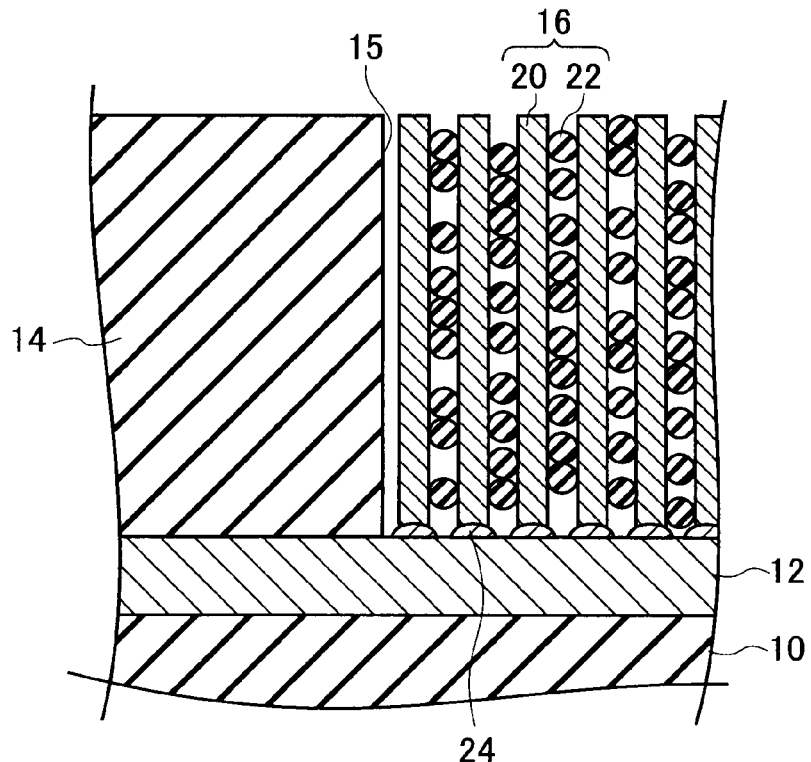

As shown in FIG. 7, a colloid impregnation solution in which carbon particles 22 are dispersed, is dropped into the through holes 15 so as to impregnate the conductive members 20 in a vacuum. After the colloid solution is dried and solidified, parts of the conductive members 20 protruding from the through holes 15 are removed by chemical mechanical polishing (CMP) and the like. Thus, a plug 16 is formed in which the carbon particles 22 are dispersed between the conductive members 20.

Figure 8:
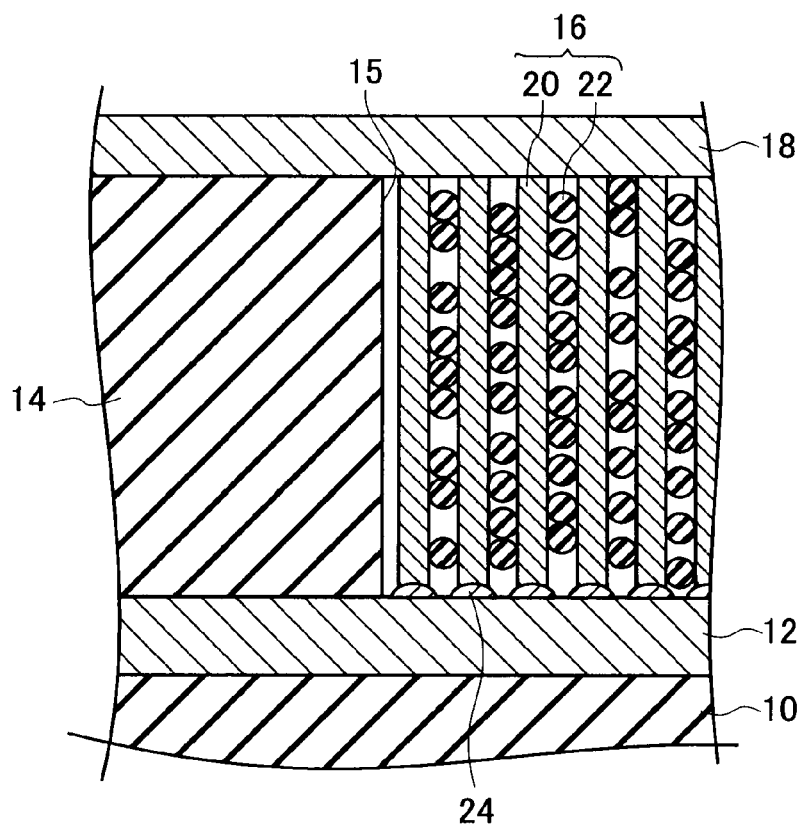

As shown in FIG. 8, a top conductive film 18, as a top wiring layer, is formed on the surfaces of the interlevel dielectric film 14 and the plug 16 by evaporation, photolithography, dry etching and the like. The other wiring layer, used for the semiconductor device, is formed on the top conductive film 18. Thus, the semiconductor device is manufactured.

Here, in the carbon nanotube deposited as the conductive member 20, the average diameter and the deposited surface density are determined by the underlying catalyst metal layer 24. For example, the catalyst metal layer 24 may be formed by depositing the metal particles, such as Co and the like, each of which has an average particle diameter of about 5 nm, with a predetermined surface density by abrasion and the like. The catalyst metal layer 24 may also be formed by heating and agglutinating a deposited metal thin film of Co and the like at a predetermined temperature. It is possible to selectively grow a bundle of carbon nanotubes, each of which has an average diameter of about 5 nm, with a predetermined surface density on the deposited metal particles.

The colloid impregnation solution in which the carbon particles 22 are dispersed is prepared as follows. Synthetic diamond particles produced by using explosives can be used as the carbon particles 22. The synthetic diamond particles are agglutinated. Therefore, the produced diamond particles are decomposed into primary particles, each of which has an average particle diameter of about 4 nm. In addition, an amorphous carbon layer is formed on each surface of the synthetic diamond particles. For example, the carbon film 28 having a crystal structure of graphene or graphite, which has conductive properties, can be formed on each surface of the diamond particles as the carbon particles 22, by a heat treatment at between about 700° C. and about 1000° C., as shown in FIG. 4. The diamond particles are dispersed in a dispersion medium including water as a main component. Thus, the colloid impregnation solution can be prepared.

When impregnating the colloid impregnation solution permeate into the through holes 15, it is desirable to modify the surfaces of the carbon nanotubes and the diamond particles with a modification group and to have the same affinities, so as to easily impregnate with the colloid impregnation solution. Usually, the carbon nanotubes after growth have a hydrophobic property. Thus, it is desirable to provide the surfaces of the diamond particles to also have a hydrophobic property. In this case, it is possible to obtain stable hydrophobic surfaces of the diamond particles by hydrogen termination.

Further, a modification group for cross-linking is preliminarily introduced on the surface of each of the diamond particles and the carbon nanotubes. Then, the modification group is excited by applying at least one of light, such as ultraviolet, an electron beam, and heat, so as to provide cross-linking structures between the diamond particles and the carbon nanotubes. The foregoing method for exciting the modification group is used in a manufacturing process of a semiconductor device, such as a LSI and the like, and implemented in a curing process of a resist film, a low-k insulating film and the like.

As an example of cross-linking formation, bonding between amino groups treated by silane finish can be used. Specifically, the respective surfaces of the diamond particles and the carbon nanotubes are made to have hydrophilic properties by acid treatment. Gamma-aminopropyltriethoxysilane (γ-APTES) acts on the surfaces of the diamond particles and the carbon nanotubes, so as to bond ethoxy groups of γ-APTES on the surfaces of the diamond particles and the carbon nanotubes. Consequently, the modification groups having the amino groups as end residues are formed on the surfaces of the diamond particles and the carbon nanotubes. Cross-linking can be implemented by bonding the amino groups of the modification groups to each other with glutaric aldehyde. After that, by applying an ultraviolet light, an electron beam, heat, the cross-linking bonded structures are carbonized so as to form carbon bonds including conductive unsaturated bonds.

Additionally, the modification groups, such as hydrocarbon groups, carbonyl groups, cyano groups, and the like, may be bonded on the respective surfaces of the diamond particles and the carbon nanotubes. It is possible to cut the bonds of the modification groups by applying an ultraviolet light, an electron beam, heat, and the like, and to form cross-linking structures or carbon bonds to each other.

According to the method for manufacturing the semiconductor device according to the embodiment of the present invention, since the carbon particles 22 are disposed between the conductive members 20, a mechanically stable retention structure is formed. Since the carbon particles 22 have thermal and chemical characteristics close to the carbon nanotubes, it is possible to equalize resistance characteristics of the carbon particles 22 and carbon nanotubes in the manufacturing processes. Also, since diamond particles are used for the carbon particles 22, it is possible to increase the strength of the interconnection structure. Also, since the thermal conductivity between the conductive members 20 can be improved, it is possible to achieve thermal stability and resistance characteristics of the interconnection structure.

Moreover, since the carbon film 28 having a $sp^2$ bond is formed on each surface of the diamond particles, the carbon particles 22 may have conductive property on the surfaces thereof. Thus, electrical conductive paths can be added through the carbon particles 22 between the conductive members 20. As a result, even if an excess current flows into a specific conductive member 20 among the bundle of conductive members 20, the current may be shunted through the surface of the conductive carbon film 28. Thus, it is possible to prevent disconnection of the conductive member 20 due to local heating thereof. Even if the conductive member 20 is broken, the current path may be assured through the carbon particles 22 in the gap between the conductive members 20. Thus, it is possible to assure electrical conduction of the broken conductive member 20, and to ensure low resistance of the plug 16.

Furthermore, by using the cross-linking structures between the conductive members 20 and the carbon particles 22, and between the carbon particles 22, it is possible to increase mechanical stability of the interconnection structure. Moreover, by using the electrically conductive C-unsaturated bonds between the conductive members 20 and the carbon particles 22, and between the carbon particles 22, it is possible to assure not only the stability of the interconnection structure, but also the electrical conductivity of the interconnection structure.

According to the method for manufacturing the semiconductor device according to the embodiment of the present invention, the carbon particles 22 are provided in the gaps between the carbon nanotubes, which naturally arise in the interconnection structure using the bundle of carbon nanotubes, so as to bond the carbon nanotubes with each other through the carbon particles. Thus, it is possible to increase the mechanical strength of the interconnection. Also, since the carbon nanotubes and the carbon particles are used, it is possible to increase thermal conduction of the interconnection and to improve thermal radiation of the interconnection. Moreover, even in the case of a local disconnection of the carbon nanotube, it is possible to assure the electrical conduction path where the carbon particles are used as the current path. Thus, it is possible to suppress increasing resistance of the interconnection. As a result, it is possible to decrease defects of the interconnection structure, and increase reliability of the semiconductor device.

OTHER EMBODIMENTS

The present invention has been described as mentioned above. However the descriptions and drawings that constitute a portion of this disclosure should not be perceived as limiting this invention. Various alternative embodiments and operational techniques will become clear to persons skilled in the art from this disclosure.

In the embodiment of the present invention, the conductive members 20 of carbon nanotubes are used in the plug 16 of the longitudinal interconnection to connect the bottom and top wiring layers. However, the carbon nanotubes are not limited to the longitudinal interconnection between the interconnection layers. For example, it is possible to use in a lateral interconnection parallel to the surface of the underlying layer. The catalyst metal layer may be deposited on vertical surfaces formed on the surface of the underlying layer, so as to grow the carbon nanotubes on the vertical surfaces.

Furthermore, in the embodiment of the present invention, the electronic device is described as a semiconductor device. However, the electronic device is not limited to a semiconductor device, and may be a liquid crystal display, a magnetic recording device, an optical recording device, a thin film magnetic head, a superconductor device, an acoustoelectric conversion device, and the like.

Various modifications will become possible for those skilled in the art after storing the teachings of the present disclosure without departing from the scope thereof.

What is claimed is:

1. An interconnection, comprising:
   a bundle of conductive members, each of the conductive members being made of carbon nanotube having an end connected to a first conductive film, and another end connected to a second conductive film separated from the first conductive film; and
   carbon particles, each of the carbon particles having a diamond crystal structure, dispersed in gaps between the conductive members.

2. The interconnection of claim 1, wherein the conductive members and the carbon particles are chemically bonded to each other by a carbon or a bonding link including carbon.

3. The interconnection of claim 1, wherein the conductive members and the carbon particles are electrically connected to each other.

4. The interconnection of claim 1, wherein each of the carbon particles comprises:
   a core having the diamond crystal structure; and
   a conductive carbon film on a surface of the core.

5. The interconnection of claim 1, wherein each of the carbon particles has an average particle diameter less than or equal to an average diameter of each of the conductive members.

6. An electronic device, comprising:
   a first conductive film provided on a substrate;
   an interconnection including:
      a bundle of conductive members, each of the conductive members being made of carbon nanotube having an end connected to the first conductive film; and
      carbon particles, each of the carbon particles having a diamond crystal structure, dispersed in gaps between the conductive members; and
   a second conductive film connected to another end of each of the conductive members, and separated from the first conductive film.

7. The electronic device of claim 6, further comprising:
   an interlevel dielectric film provided between the first and second conductive film, and having a through hole in which the interconnection is provided.

8. The electronic device of claim 6, wherein the conductive members and the carbon particles are chemically bonded to each other by a carbon or a bonding link including carbon.

9. The electronic device of claim 6, wherein the conductive members and the carbon particles are electrically connected to each other.

10. The electronic device of claim 6, wherein each of the carbon particles comprises:
    a core having the diamond crystal structure; and
    a conductive carbon film on a surface of the core.

11. The electronic device of claim 6, wherein each of the carbon particles has an average particle diameter less than or equal to an average diameter of each of the conductive members.

* * * * *

UNITED STATES PATENT AND TRADEMARK OFFICE
CERTIFICATE OF CORRECTION

PATENT NO.         : 8,053,678 B2                                                          Page 1 of 1
APPLICATION NO.    : 12/062112
DATED              : November 8, 2011
INVENTOR(S)        : Sakai et al.

It is certified that error appears in the above-identified patent and that said Letters Patent is hereby corrected as shown below:

On the title page, Item (73), the Assignee information is incorrect. Item (73) should read:

-- (73) Assignee: Kabushiki Kaisha Toshiba, Tokyo (JP) --

Signed and Sealed this
Seventeenth Day of January, 2012

David J. Kappos
*Director of the United States Patent and Trademark Office*